United States Patent
Grube et al.

(10) Patent No.: US 6,777,319 B2
(45) Date of Patent: Aug. 17, 2004

(54) MICROELECTRONIC SPRING CONTACT REPAIR

(75) Inventors: Gary W. Grube, Pleasanton, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 55 days.

(21) Appl. No.: 10/028,500

(22) Filed: Dec. 19, 2001

(65) Prior Publication Data

US 2003/0113990 A1 Jun. 19, 2003

(51) Int. Cl.[7] .............................................. H01L 21/44
(52) U.S. Cl. ..................... 438/612; 438/678; 438/669; 438/4; 438/52
(58) Field of Search ................................ 438/612, 678, 438/669, 670, 671, 4, 52

(56) References Cited

U.S. PATENT DOCUMENTS

| | | | | |
|---|---|---|---|---|
| 6,103,399 A | * | 8/2000 | Smela et al. | 428/623 |
| 6,302,702 B1 | * | 10/2001 | Audet et al. | 439/66 |
| 6,436,802 B1 | * | 8/2002 | Khoury | 438/612 |
| 6,452,407 B2 | * | 9/2002 | Khoury et al. | 324/754 |
| 6,584,678 B2 | * | 7/2003 | Burgess et al. | 29/622 |

* cited by examiner

Primary Examiner—Caridad Everhart
(74) Attorney, Agent, or Firm—N. Kenneth Burraston; O'Melveny & Myers LLP

(57) ABSTRACT

A method for replacing a microelectronic spring contact bonded to a terminal of a substrate is disclosed. The method includes removing the microelectronic spring contact from the terminal, such as by cutting the microelectronic spring contact in two adjacent to the terminal. Then, a bonding material, such as a solder paste, is applied to the terminal and a replacement spring contact is positioned on the bonding material. The bonding material is then cured to fix the replacement spring contact in place. The replacement spring contact includes a base configured to fit on or over any protruding material left on the terminal, and at least one resilient cantilever arm extending from the base. In an embodiment of the invention, the base includes at least two legs extending from the base in a direction opposite to the cantilever arm. In an alternative embodiment, the base of the replacement spring contact has a flat bottom, or one or more recesses to receive protrusions on the terminal. The replacement spring contact is positioned with its base opposite to the terminal and the resilient cantilever arm extending away from the substrate. A method for forming a suitable replacement spring contact is also disclosed.

47 Claims, 7 Drawing Sheets

FIG. 1
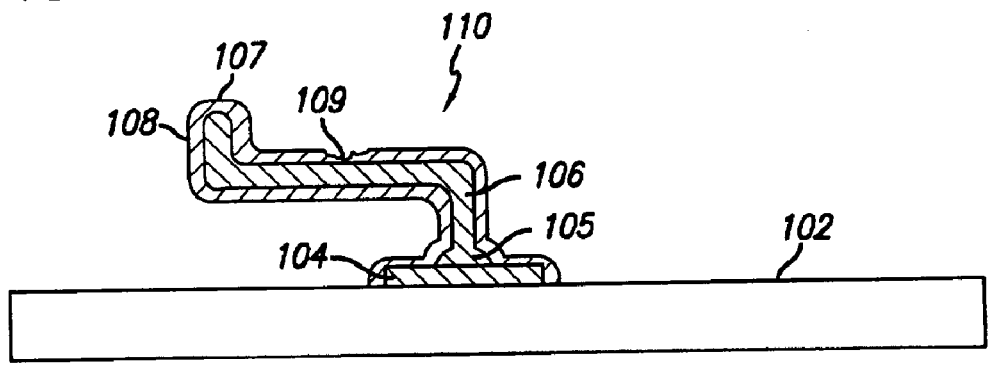
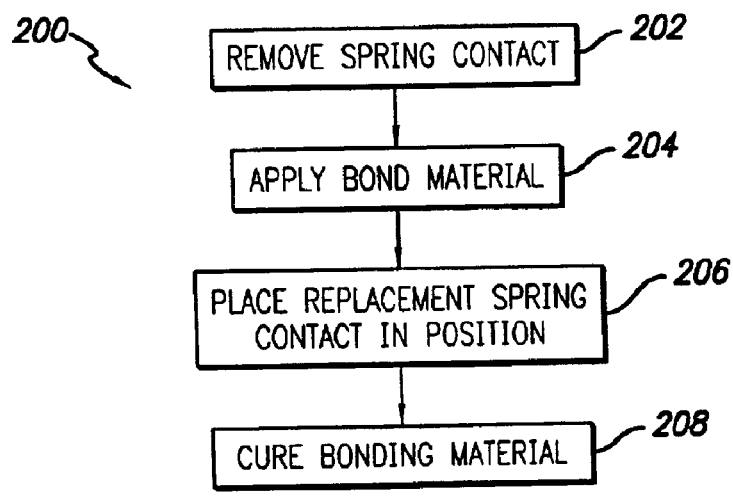
FIG. 2
FIG. 3A
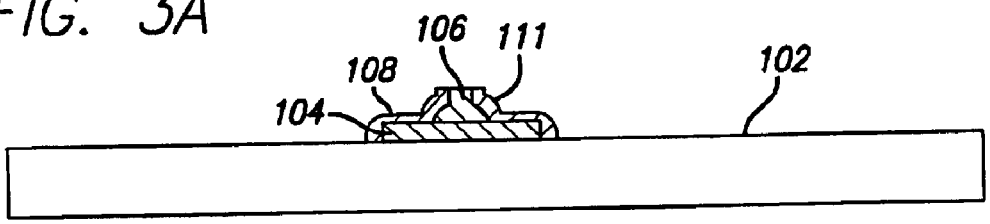

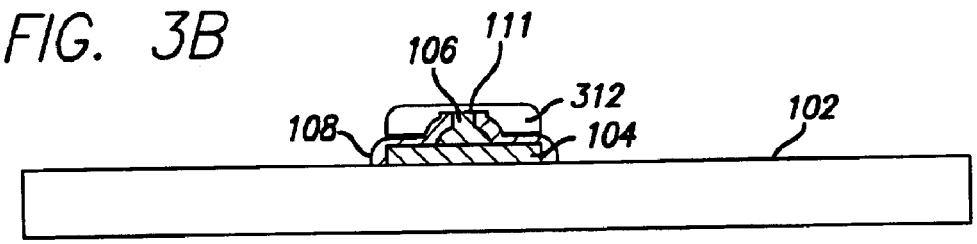
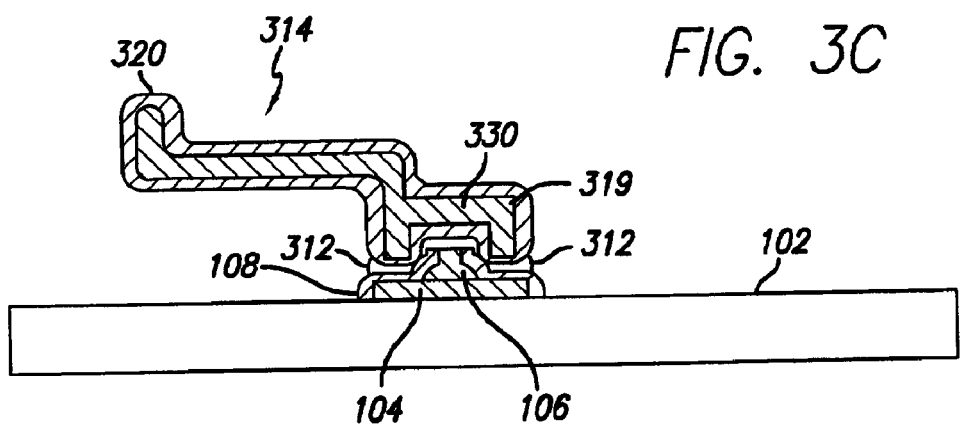
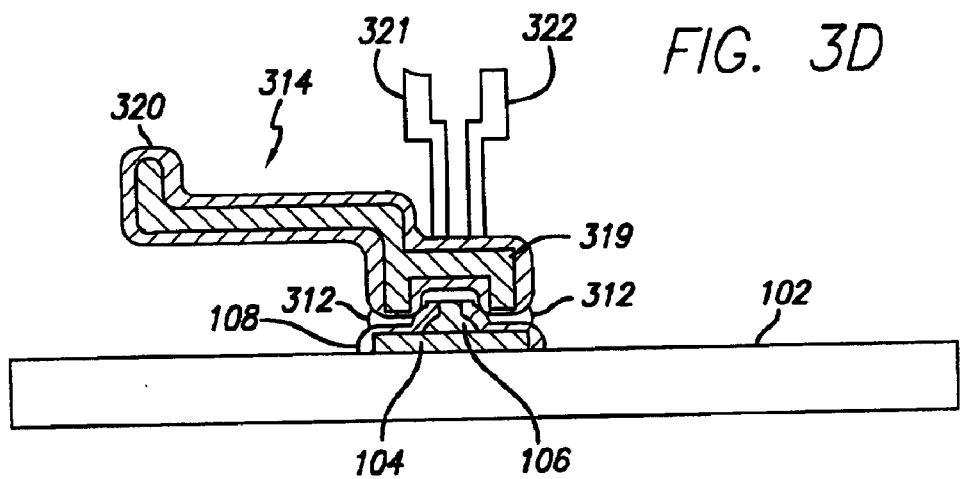

MICROELECTRONIC SPRING CONTACT REPAIR

BACKGROUND OF THE INVENTION

1. Field of the Invention

The present invention relates to microelectronic spring contacts such as are used in semiconductor wafer testing and other electronic connection applications. More particularly, the invention relates to a method for repairing individual spring contacts without causing appreciable damage to adjoining spring contacts of an array.

2. Description of Related Art

Microelectronic spring contacts, such as disclosed, for example, by U.S. Pat. No. 5,476,211, are known in the art and have been applied in fine-pitch, high-density arrays for various applications. For example, microelectronic spring contacts of various types have been used on probe cards for contacting semiconductor wafers during testing, on interposers used in probe card assemblies, directly on semiconductor wafers and chips, and in connectors for mounting semiconductor components to test or production substrates. Such applications typically demand that a large plurality of almost microscopic spring contacts be arrayed in a high-density, fine-pitch array over an electronic substrate. For example, it is not unusual for hundreds or even thousands of microelectronic spring contacts to be arrayed over an area of a few square centimeters.

The individual spring contacts, however, may be damaged during manufacture or post-manufacturing handling or use. The damage may reduce the performance of the spring contacts or even render them unusable. Prior efforts to repair fine-pitch, high-density arrays of microelectronic spring contacts have been limited to reshaping (bending) individual spring contacts that are bent out of shape. When spring contacts were defective or damaged in such a way that they could not be repaired by reshaping, there was no way to repair or replace the defective spring contacts and thus save the entire array.

Prior limitations in the repair of individual spring contacts stem from the methods for making high-density spring contact arrays. Such arrays are not made by assembling individually formed spring contacts on a substrate. Instead, the entire array is formed en masse with each microelectronic spring contact formed in position on a substrate. For example, some methods of making microelectronic spring contacts, such as disclosed in U.S. Pat. Nos. 5,476,211, 5,919,707, and 6,110,823, all of which are incorporated by reference herein in their entirety, involve bonding relatively soft gold wires to a substrate while shaping the wires to the desired spring contact shape. The shaped wires are then electroplated together to build up a structural layer that stiffens the spring contacts and imparts the required strength and resiliency. Similarly, other methods, such as disclosed in U.S. Pat. No. 6,255,126 and in commonly-owned U.S. application Ser. No. 09/023,859, filed Feb. 13, 1998; Ser. No. 09/474,788, filed Dec. 29, 1999; and Ser. No. 09/364,855, filed Jul. 30, 1999, all of which are incorporated by reference herein in their entirety, involve building arrays of spring contacts on substrates using lithographic and electroplating techniques to form individual spring contact elements together in an array. Methods such as these are generally not suitable for replacing an individual spring contact in a completed array, because surrounding spring contacts of the array would impair and/or be damaged by the plating, etching and/or other operations needed to repair or replace the damaged spring contact.

It is desired, therefore, to provide a method for repairing or replacing an individual damaged spring contact of a fine-pitch, high-density array of microelectronic spring contacts.

SUMMARY OF THE INVENTION

The present invention provides a method for repairing an individual spring contact of a microelectronic spring contact array without adversely affecting other spring contacts of the array. The method may be easily and quickly implemented using processing equipment and tools such as are used for the manufacture of the microelectronic spring contact arrays themselves. Using the method, high density arrays such as used, for example, on probe cards for wafer testing applications, may be repaired at a much lower cost, and much more quickly, than replacing the entire array with a new array.

According to an embodiment of the invention, a damaged spring contact is removed from the substrate of a contact array and replaced by a specially shaped replacement spring contact. The damaged spring contact may be removed by cutting through the spring at a location adjacent to the substrate. Less preferably, the damaged spring contact may be removed by heating the base of the spring contact using a localized method, such as an electrode or laser. In the case of cutting the spring, the damaged spring may, and generally does, leave behind a stub attached to a terminal of the substrate. The uneven surface presented by the stub and terminal should be accounted for in the design of a replacement spring. It is generally not practical to planarize a single terminal for a replacement spring without damaging or contaminating the surrounding array.

A replacement spring contact for the removed spring contact may be formed by any suitable method. Preferably, the replacement spring contact is formed by defining the spring contact profile in a recess of a sacrificial layer over a sacrificial material, and plating up a spring contact material in the recess. A relatively complex replacement spring contact may thus be formed at a very small scale (e.g., microscopic or nearly microscopic) in a single plating cycle. Preferably, a plurality of similar replacement spring contacts are formed together and optionally attached together by tie bars not unlike a connecting sprue of co-molded injection molded parts. Individual replacement spring contacts may then be conveniently stored together and removed from the tie bars as needed. This profile-defining lithographic method is believed best for forming relatively small quantities of free-floating, relatively complex spring contact shapes, and hence is preferred for forming replacement spring contacts.

Nevertheless, alternative methods for forming the replacement spring contact may include stamping, punching, or cutting, such as by using a laser; or metal molding techniques such as powder metal metallurgy. These methods may be less suitable for forming replacement spring contacts at very small scales. Other alternative methods include the wire forming/plating and lithographic techniques such as disclosed in the references cited above, or some combination thereof. Such methods may be adapted to form replacement spring contacts on a sacrificial substrate, and then the sacrificial substrate may be removed to provide a free-floating spring. These wire-forming and lithographic methods are effective at very small scales, but may require more production steps to produce a replacement spring contact than the preferred method described above.

However the replacement spring contact is formed, the final spring contact may need to conform to exacting specifications for the removed spring contact. In general, the replacement spring contact should be shaped to present a contact tip in the same location as the removed spring contact. Furthermore, the replacement spring contact should have spring characteristics, including spring constant, yield strength, and fatigue strength, that are the same or similar to the removed spring contact's design values. The replacement spring contact should deflect in both z and x directions (i.e., perpendicular and parallel to the support substrate) within the tolerances for the design values of the removed spring contact. For example, the replacement spring contact should exhibit a wiping action (x deflection) within the design tolerance for the removed spring contact. The replacement spring contact should have electrical characteristics that meet the requirements of the spring contact array, and should be bonded to the terminal of the removed spring contact in a way that does not interfere with adjoining spring contacts or terminals.

In an embodiment of the invention, the replacement spring contact has a shape that is similar to the removed spring contact, except for at its base. The base of the replacement spring contact is preferably shaped to fit over the terminal from which the damaged spring has been removed, including any protruding posts or stubs that may remain on the terminal after the damaged spring contact has been removed. In an embodiment of the invention, the replacement spring contact differs from the removed spring contact in having a base formed of two or more spaced-apart legs connected by a base. The legs and connecting base may be designed to span the terminal of the removed spring contact, or a portion thereof. A resilient, cantilevered arm, having a shape that may be similar to the cantilevered portion of the removed spring contact, extends from the base in a direction opposite to the legs. The spaced apart legs are designed to accommodate any unevenness in the terminal of the removed spring, such as may be created by the stub of the removed spring contact. In alternative embodiments, the base of the replacement spring may be flat, or may include one or more recesses to fit over protrusions on the terminal.

To replace the removed spring, a bonding material, such as a solder paste, is applied to the terminal of the removed spring. The replacement spring is then positioned on the solder paste (or other bonding material) with its legs positioned around or near the periphery of the terminal, and aligned so that its contact tip is as close as possible to the design tip position for the removed spring. The replacement spring is then soldered or bonded in place, such as by connecting an electrode to the base of the spring and passing a current through the electrodes, thereby generating localized heat. After the solder hardens, minor corrections may be made to the contact tip position by manual adjustment (bending) of the spring's cantilever arm.

It should be appreciated that the foregoing method for replacing a damaged spring contact may, of course, also be used to form spring contacts in an original component. In such case, the step of removing the damaged spring contact is omitted, and the remaining steps may be performed as previously described above.

A more complete understanding of the method for repairing a microelectronic spring contact will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 1 is an enlarged side cross-sectional view of a damaged spring contact mounted to a terminal of a substrate.

FIG. 2 is a flow chart showing exemplary steps for repairing a damaged spring contact.

FIGS. 3A–3D are enlarged cross-sectional views showing the substrate of the damaged spring contact, the replacement spring contact, and related elements, at successive exemplary instants during the repair method.

DETAILED DESCRIPTION OF THE PREFERRED EMBODIMENT

Figure 4:
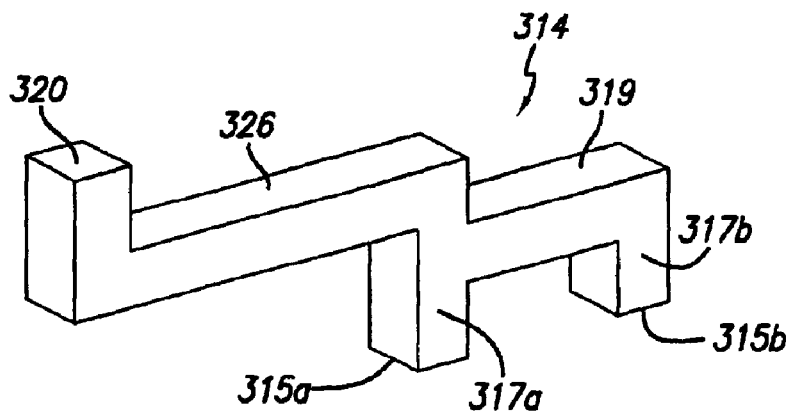
FIG. 4 is an enlarged perspective view of an exemplary replacement spring contact.

The present invention provides a method for repairing a microelectronic spring contact by removing at least a portion of the damaged spring contact, forming a replacement spring contact designed to match the performance and geometry of the removed spring contact, and bonding the replacement spring contact to the terminal and/or remaining portion of the removed spring contact. In the detailed description that follows, like element numerals are used to indicate like elements that appear in one or more of the figures.

FIG. 1 shows an exemplary damaged spring contact 110 mounted to a terminal 104 of a substrate 102. These elements are not themselves features of the present invention, and are shown as background for illustrating application of the invention. Spring contact 110 may be any type of resilient, microelectronic spring contact, for example, such as disclosed in U.S. Pat. Nos. 5,476,211 or 6,255,126. Although the particular details of the damaged spring contact do not limit the present invention, such details may be helpful for understanding the exemplary application of the method described herein. It should be appreciated that, in the general case, spring contact 110 will be closely surrounded by a plurality of like spring contacts of a spring contact array. For simplicity, these surrounding spring contacts are not shown in FIG. 1 or in the figures that follow. Advantageously, the present invention provides a method for repairing the damaged contact 110 with minimal or no disturbance or damage to these surrounding spring contacts.

The particular spring contact 110 is of a type comprising a soft wire core 106 (such as a gold wire) that is bonded to terminal 104 at its base 105. The wire core 106 is cut to length and shaped as shown, and then plated with a outer layer 108 of harder, resilient metal (such as a nickel-cobalt alloy). The tip 107 of the spring contact is used to contact the terminal of the desired mating component. Spring contact 110 may comprise other features, such as an outer gold conducting layer or a separately-formed tip structure, that are not shown. Other spring contact types, such as core-less spring contacts formed by plating resilient material in a patterned sacrificial layer, may also be repaired using the present method. Terminal 104 generally comprises a metallic pad, and substrate 102 may be any suitable substrate, including a probe card, ceramic, or semiconductor material.

In FIG. 1, the damaged spring contact 110 has a damaged portion 109 that may have been caused, for example, by a defect in resilient layer 108. The damage cannot be corrected by merely manipulating the spring contact to impart a different spring contact shape. Such defects may arise during or after manufacturing. For example, damage may be caused by mishandling of a spring contact array.

FIG. 2 is a flow chart showing exemplary steps of a method 200 for repairing a damaged spring contact. At step 202, at least a portion of the damaged spring contact 110 is removed from the terminal as needed. In many applications, the damaged spring contact is bonded to its terminal in a way that is not readily de-bondable. For example, with reference to FIG. 1, the spring contact 110 is ball bonded at its core 106 to terminal 104, and is also bonded by adhesion of its plated layer 108 to terminal 104. Consequently, it may be difficult to remove the entire spring contact structure 110 without damaging the terminal 104, substrate 102, and/or any adjoining spring contact structures. In such case, the spring contact may be removed by trimming the spring contact adjacent to its base 105, leaving a stub 111 protruding from terminal 104, as shown in FIG. 3A. In other instances, the spring contact may be bonded to its terminal using a low temperature material, such as a solder, so it may be possible to remove an individual spring contact by localized heating of the terminal and base of the spring contact.

Referring again to FIG. 2, at step 204, a bonding material is applied to the terminal 104. The bonding material may be any suitable solder paste as known in the art. The solder paste is preferably selected to have an activation temperature lower than the re-flow temperature of solder that may be present in adjacent spring contacts or other features connected to substrate 102. In the alternative, the bonding material may be any other suitable conductive adhesive. FIG. 3B shows the terminal 104 and the stub 111 covered with a dollop of solder paste 312.

At step 206, a replacement spring contact is positioned on the bonding material and terminal 104. FIG. 3C shows an exemplary replacement spring contact 314 placed in position on the bonding material 312. The replacement spring contact may be temporarily held in position by the dollop of bonding material alone, or in combination with a tool or fixture (not shown).

The replacement spring contact 314 has a shape similar, but not identical to, the design shape of the original damaged spring contact 110. For example, replacement spring contact 314 does not, by itself, extend as far away from the substrate 102 as did the removed spring contact 110. Therefore, after being stacked on top of the terminal 104, stub 111, and bonding material 312, the contact tip 320 of the replacement spring contact will be positioned substantially the same distance away from substrate 102 as was the contact tip 107 of the removed spring contact 110. The shape of replacement spring contact 314 may additionally differ in other respects from the shape of the removed spring contact 110. Whatever its shape, the replacement spring contact should be selected to duplicate the mechanical and electrical characteristics of the removed spring contact as closely as is required by the intended application. Both the shape of the replacement spring contact and its materials are preferably as close as possible to the shape and materials of the removed spring contact, subject to limitations such as may be imposed by the preferred fabrication method and the method of attaching the replacement spring to the terminal and/or substrate.

It should be noted that a separately fabricated tip structure may be attached to contact tip 320. Exemplary tips and methods of fabricating such tips and attaching the tips to a spring contact are described and illustrated in U.S. Pat. No. 5,994,152, U.S. patent application Ser. No. 08/819,464, filed Mar. 17, 1997, now abandoned, U.S. patent application Ser. No. 09/023,859, filed Feb. 13, 1998, and U.S. patent application Ser. No. 09/189,761, filed Nov. 10, 1998, all of which are incorporated herein by reference in their entirety.

In an embodiment of the invention, the replacement spring contact 314 comprises a core 330 of a relatively hard, resilient material, such as a nickel-cobalt alloy, coated with a relatively thin layer of gold or gold alloy 332 for corrosion protection and superior conductivity. In FIGS. 3C and 3D, the thickness of the gold layer 332 relative to the core 330 is exaggerated. Any other suitable materials or layers of materials may be used for replacement spring contact 314, although the foregoing combination is believed advantageous for many applications. Further details concerning the replacement spring contact 314 are described below in connection with FIGS. 4–7.

At step 208, the bonding material 312 is cured or hardened as known in the art. FIG. 3D shows a pair of electrodes 321, 322 being applied to the base 319 of the replacement spring contact 314 according to an embodiment of the invention wherein the bonding material is a solder paste. A current is passed between the electrodes and through the base 319 to heat the base 319, solder 312, and the underlying terminal 104 and stub 111. When the solder re-flows, the current in the electrodes is turned off and the solder hardens to fix the replacement spring contact 314 firmly in position. The electrodes 321, 322 are removed and the replacement spring contact and surrounding spring contact array (not shown) are then ready for use. If necessary, the position of contact tip 320 may be adjusted by manipulation of the cantilevered portion 326 of the spring contact 314.

Other methods besides electrodes may be used to heat the solder 312. For example a soldering iron or heater may be used to heat the spring contact or the solder directly. In addition, one of electrodes 321, 322 may be electrically connected to a conductive trace or wiring on or in substrate 102 that is electrically connected to terminal 104.

FIG. 4 is an enlarged perspective view of the exemplary replacement spring contact 314 described above. The replacement spring contact 314 comprises five components: a contact tip 320, a base 319, a resilient cantilevered arm 326 extending between the contact tip and the base, and two legs 317a, 317b extending from the base opposite to the arm. Contact tip 320 replaces, and is preferably identical or very similar to, the contact tip of the removed spring contact. Cantilevered arm 326 positions the tip in the proper location and provides resiliency to the spring contact 314. Base 319 supports the arm and is configured to fit over the terminal and provide a bonding surface for adhering to the terminal and stub of the removed spring contact. Legs 317a, 317b elevate the arm above the substrate, provide additional bonding surfaces for adhesion to the terminal and stub, and provide relatively small feet 315a, 315b that aid in positioning the replacement spring contact over an uneven surface, such as presented by the terminal and stub of the removed spring contact. Legs 317a, 317b may be of equal length (as shown), or may be of unequal length. Unequal lengths may be useful for accommodating a sloped base 319 and/or sloped arm 317, or in the alternative, may be used to accommodate unevenness in the terminal or substrate. For example, a first leg could be used to contact the terminal and a second, longer leg could be used to contact the substrate adjacent to the terminal or a conductive trace adjacent the terminal. In addition, more than two legs could be used, if desired. It should be apparent that various different shapes may also be suitable for the replacement spring contact 314, without departing form the scope of the invention.

Figure 5:
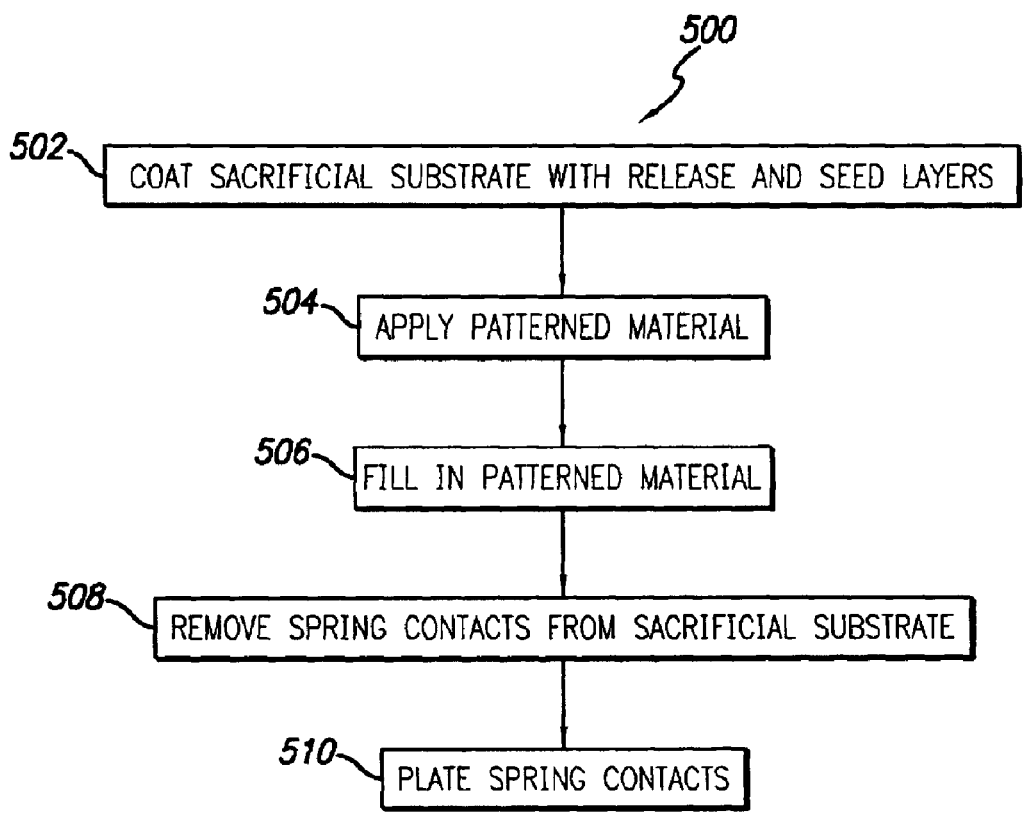
FIG. 5 is a flow chart showing exemplary steps of a method for forming a replacement spring contact.

Forming a suitably shaped and configured replacement spring contact at the necessary small scale is not a trivial matter. Prior methods for forming large arrays of many microelectronic spring contacts are not particularly well suited for forming individual replacement spring contacts. Among other things, replacement spring contacts differ from spring contacts in massive arrays in that the replacement spring contact should be loose (not attached to a substrate) after being formed. Also, replacement spring contacts should be capable of being readily manipulated and positioned in place on the substrate to be repaired without damage to the replacement spring contact or any adjacent spring contacts. FIG. 5 shows exemplary steps of a method 500 for forming a replacement spring contact that provides advantages over prior art methods of forming replacement spring contacts. The method 500 may also be used for forming spring contacts for purposes other than repair; for example, for forming specialty spring contacts for custom arrays. Alternatively, the method 500 could be used to form the original spring contacts rather than replacement spring contacts as described herein. In such a case, the spring contacts are preferably made with a solid base portion rather than a two-legged base portion as shown in FIG. 4. Nevertheless, the specific configuration of the base portion of the spring contact (as with other portions of the spring contact) is not critical to the invention and any configuration may be used, including without limitation a two-legged configuration as shown in FIG. 4, a single, solid base as shown in FIG. 9B, or a base with one or more recesses (not separately shown, although the space between the two legs 317a, 317b shown in FIG. 4 is an example of one such recess) for accommodating protrusions on the terminal.

At step 502, a sacrificial substrate is prepared and coated with release and/or seed layers. The sacrificial substrate may be a silicon substrate such as used for semiconductor wafer manufacturing, or any other suitably smooth planar material that is compatible with the materials that will be used in subsequent steps of the method 500. The term "sacrificial" as used herein denotes that the associated substrate or layer will be removed from the finished structure to be formed using method 500; it does not require that the substrate be destroyed or rendered unusable. Silicon is preferred because it is commonly available and suitable for use with many different photoresist materials, etching solutions, etching techniques, plating solutions, metals, and so forth, such as are known and commonly used in the art of semiconductor device manufacturing.

The silicon substrate is cleaned and coated with a release layer as known in the art. The release layer may be a thin aluminum layer deposited by an electroless technique such as physical vapor deposition, or any other suitable material deposited in a thin layer. Aluminum is suitable because it is inexpensive and readily deposited in a thin layer, while being compatible with subsequent material layers. Aluminum also will quickly dissolve in commonly available etchants that will not damage the replacement spring contact to be formed on the substrate. A seed layer, such as a copper layer, may then be deposited on the release layer in preparation for a subsequent electroplating step.

At step 504, a layer of sacrificial material is deposited on the seed layer and patterned to provide a plating mask for one or more replacement spring contacts to be formed on the substrate. The sacrificial material may comprise a photoresist material such as SU-8, or any other patternable material. The sacrificial material is preferably deposited to a thickness that is about equal to the desired width of replacement spring contact. For example, the sacrificial layer may be about one to eight mils (about 25 to 200 micrometers) thick, although the invention is not limited to layers of such thickness. One or more sacrificial layers may be deposited in sequence to build up the desired thickness. Once a suitably thick layer is achieved, it is patterned, such as by exposing the layer to ultraviolet light through a pattern mask to cure selected areas of the layer (if a negative resist is used), and then removing uncured areas from the substrate by dissolving in a suitable solvent. In the alternative, a positive resist may be used instead of a negative resist, and patterned in a corresponding manner. The patterned sacrificial layer should present one or more recesses each defining the profile of a replacement spring contact. Plural replacement spring contacts may each optionally be connected to a common connecting recess through a relatively narrow connecting channel.

Figure 6A:
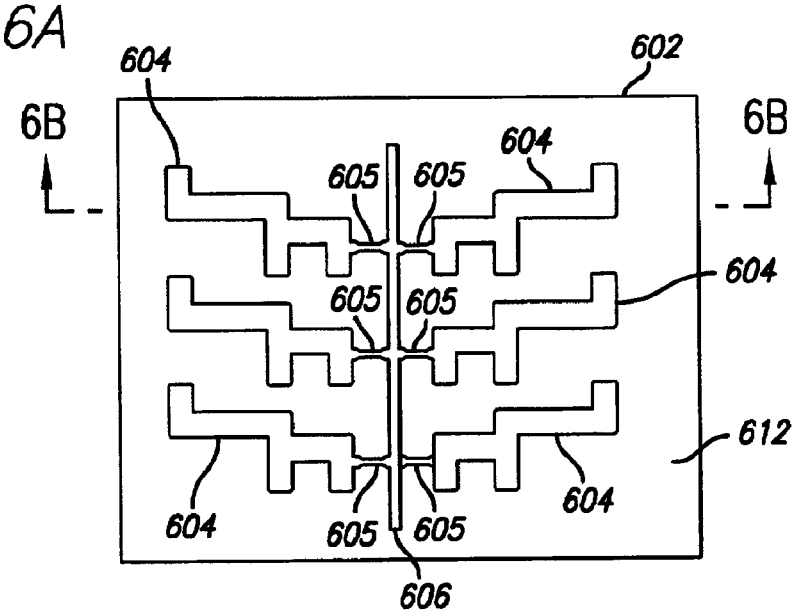
FIG. 6A is an enlarged plan view showing a sacrificial substrate and patterned layers thereon during an exemplary time of a method for forming a replacement spring contact.
Figure 6B:
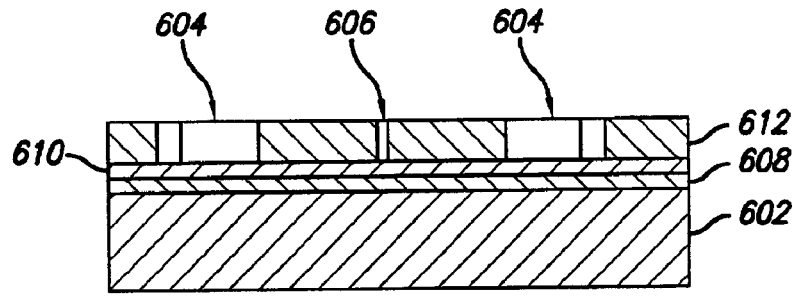
FIG. 6B is an enlarged cross-sectional view of a sacrificial substrate and patterned layers thereon during an exemplary instant of a method for forming a replacement spring contact.

FIG. 6A shows a plan view of an exemplary sacrificial substrate 602 and patterned layer 612 after completion of step 504. A cross-sectional view through section 6B—6B is shown in FIG. 6B. Six identical recesses 604 are shown in the sacrificial layer 612, each recess 604 being shaped to define a desired replacement spring contact in profile. Any number of similar recesses 604, or differently shaped recesses for various different replacement spring contacts, may be provided in sacrificial layer 612. Each spring contact-shaped recess 604 is optionally connected to a common recess 606 via a narrow connecting channel 605. Each narrow connecting channel 605 should be substantially narrower than each recess 604 and connect to a wall of its associated recess 604 that will not define a critical surface of the desired replacement spring contact. For example, in FIG. 6A, each connecting channel leads into a wall of each recess 604 that will define the rear surface of the outermost leg projecting from the base of the replacement spring contact. In the alternative, the common recess 606 and connecting channels 605 may be omitted, in which case the finished spring contacts will not be connected after being removed from the sacrificial layer.

As can be seen in FIG. 6B, the recesses 604 extend through the sacrificial layer 612 to expose the seed layer 610 at the bottom of each recess. Sacrificial layer 612 thereby forms a plating mask for plating up replacement spring contacts in the shape of recesses 604. Seed layer 610, which as previously described, may be a copper layer, may lie on a release layer 608 which, in turn, covers a surface of the substrate 602. The thickness of layers 608, 610 are not drawn to scale relative to the thickness of sacrificial layer 612, and are instead exaggerated. For example, layers 608, 610 may suitably be 250 to 50,000 angstroms in thickness, although this range is exemplary only, and the invention is not limited to use with seed and/or release layers having a thickness in this range.

Referring again to FIG. 5, at step 506 of method 500, the recesses 604, 605, and 606 are at least partially filled with a resilient material. In an embodiment of the invention, the recesses are filled by electroplating a metallic material in the recesses. For example, where the desired replacement spring contact material is nickel-cobalt, the recesses are filled to the desired depth by electroplating in a nickel-cobalt solution. Seed layer 610 provides the electroplating ground potential. Other surfaces of the sacrificial layer and substrate are not exposed to ground, and are not electroplated. After the desired depth of fill is achieved, the sacrificial layer is removed, such as by using a laser ablation process or etching, and then cleaning using a reactive ion etch or chemical solution. Although not shown in FIG. 5, the thickness of the resilient material may optionally be adjusted by grinding or polishing the material.

At step 508, the plated-up spring contact structures are removed from the substrate. The seed layer 610 is selectively etched away except for underneath the plated-up structures, and then the entire release layer 608 is removed by etching, thereby freeing the plated-up structures from the substrate 602. Any remaining portion of the seed layer 610 may then be removed, such as by selective etching. A relatively thin gold layer is then preferably plated or otherwise deposited over the external surfaces of the spring contacts, for corrosion protection and improved conductivity. The individual spring contacts may then be removed from any connecting structure and used as previously described.

Figure 7:
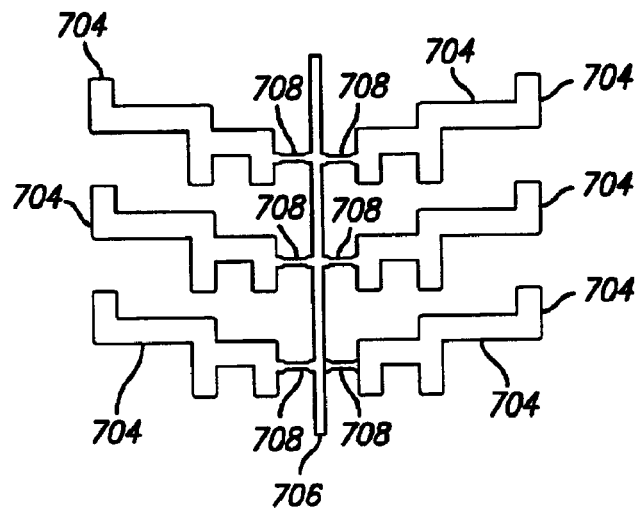
FIG. 7 is an enlarged plan view of a plurality of finished replacement spring contacts connected together by a sacrificial bar.

FIG. 7 is an enlarged plan view of a plurality of finished replacement spring contacts 704 connected together by a tie bar 706 and tabs 708. Individual spring contacts 704 may be broken off from the tie bar by flexing an appropriate tab, for use as a replacement spring contact or for any other purpose. It should be apparent that a great variety of spring contacts of various different shapes may thus be formed using method 500. As mentioned earlier, the shape of the spring contact may be chosen to meet the needs of the specific application.

Figure 8:
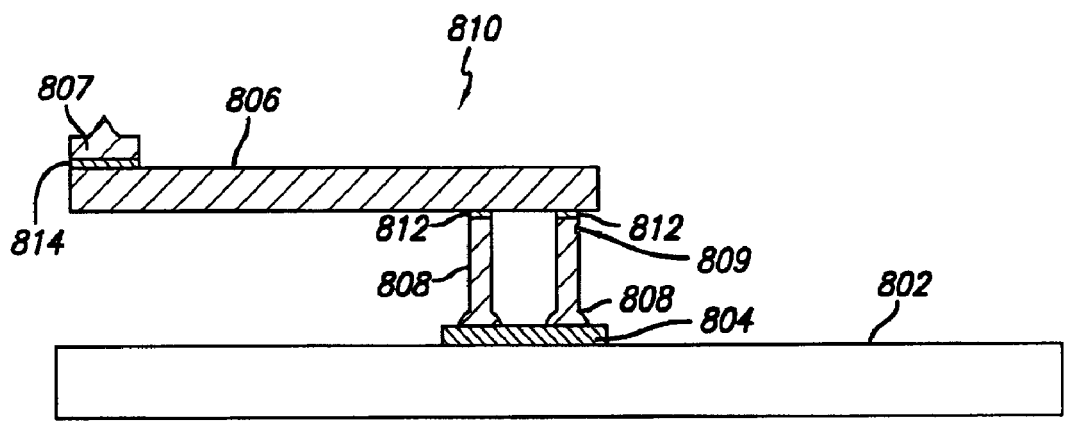
FIG. 8 is an enlarged side cross-sectional view of a damaged spring contact mounted to a terminal of a substrate.
Figure 9A:
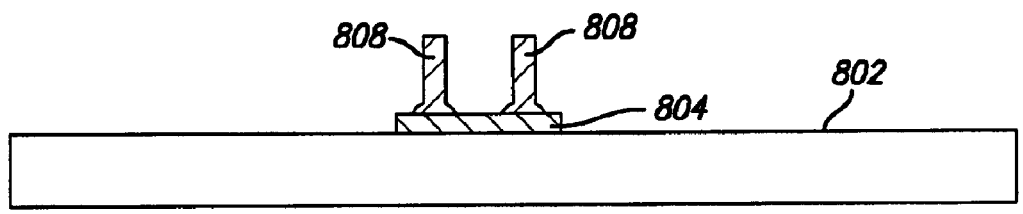
FIGS. 9A and 9B are enlarged cross-sectional views showing the substrate of the damaged spring contact, the replacement spring contact, and related elements, at successive exemplary instants during the repair method.
Figure 9B:
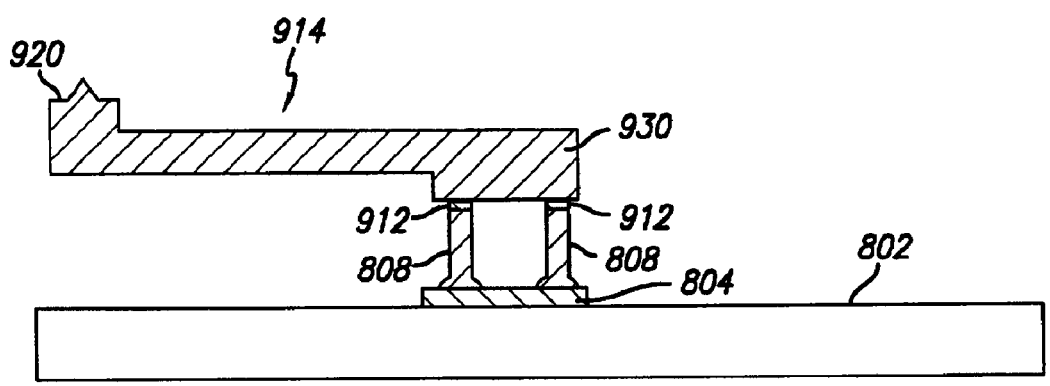

FIGS. 8, 9A, and 9B show an exemplary application of the processes of the repair method 200 to another type of spring contact structure. FIG. 8 shows a spring contact 810 in need of repair. The contact 810 comprises two posts 808, a beam 806, and a tip structure 807. The posts 808 are wire bonded to a terminal 804 of a substrate 802. Solder 812 joins posts 808 to beam 806, and solder 814 joins beam 806 to tip structure 807. Because of a damaged portion 809 on one of the posts, it is desired to repair the spring contact 810.

In FIG. 9A, the posts are clipped to remove the damaged portion 809. In this example, the height of the remaining posts 808 is relatively great. Instead of being clipped close to terminal 804, the posts have been clipped just below the damaged portion 809. A replacement spring contact 914 having a base portion 930 and a tip portion 920 configured to fit over the terminal 804 with its attached posts 808 is fabricated and soldered to the posts 808 by solder 912, all in accordance with the methods 200 and 500 described above in connection with FIGS. 2 and 5, respectively. The base portion 930 of the replacement spring contact 914 may advantageously be formed as a single, solid piece (as shown) instead of plural legs. The solid, flat-bottomed base may be easier to position on top of the protruding posts 808. Recesses (not shown) may optionally be provided in the bottom of base 930 to accommodate the tops of posts 808, thereby facilitating positioning of contact 914 on posts 808. In the alternative, legs may be provided in the manner previously described, to reach all the way to the surface of terminal 804 and/or substrate 802. The thickness of base 930 is generally related to the removed height of posts 808. That is, as more height is removed from posts 808, base 930 will generally be made thicker.

In the alternative, method 200 can be used to repair other types of spring contacts, such as spring contacts similar to spring contact 810 shown in FIG. 8, in which the plural posts 808 are replaced by a single post that is lithographically formed on pad 804. Examples of such spring contacts are illustrated and described in above-mentioned U.S. Pat. No. 6,255,126 and in commonly-owned U.S. application Ser. No. 09/023,859, filed Feb. 13, 1998; Ser. No. 09/474,788, filed Dec. 29, 1999; and Ser. No. 09/364,855, filed Jul. 30, 1999.

Figure 10A:
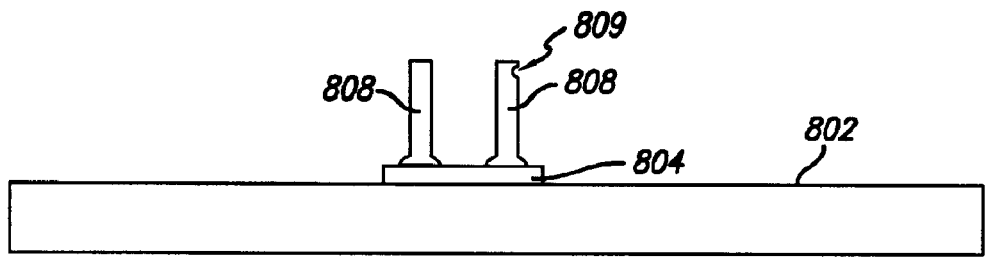
FIGS. 10A–10E are enlarged side views showing the replacement spring contact and related elements at successive exemplary instants of an alternative repair method.
Figure 10B:
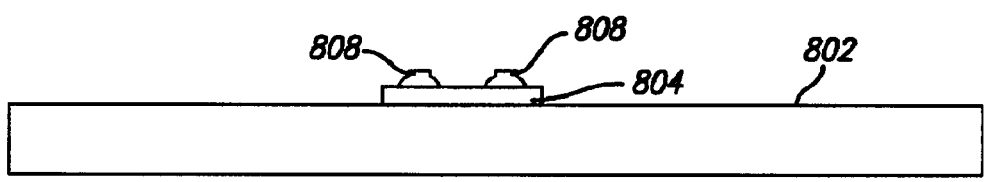

FIGS. 10A–10E show elements of the damaged and repaired spring during an alternative embodiment of method 200. This embodiment may be preferable for repairing damaged springs like spring 810 shown in FIG. 8. Instead of clipping the posts, the beam 806 and its attached tip 807 (shown in FIG. 8) are first removed from the posts 808, leaving the posts at their full height on the substrate 802, as shown in FIG. 10A. Preferably, the beam is removed by de-soldering or other method that does not damage the beam, so that the beam and its attached tip may be set aside for later use in the repaired spring. The exposed posts 808 are then clipped off, preferably as close as possible to the terminal 804, leaving short stubs of the removed posts 808, as shown in FIG. 10B.

Figure 10C:
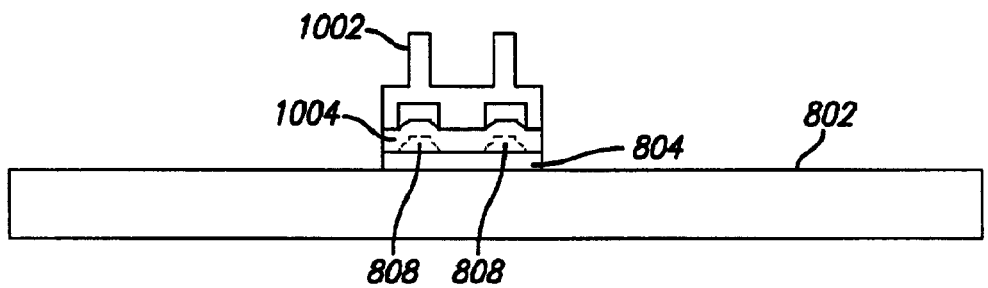
Figure 10D:
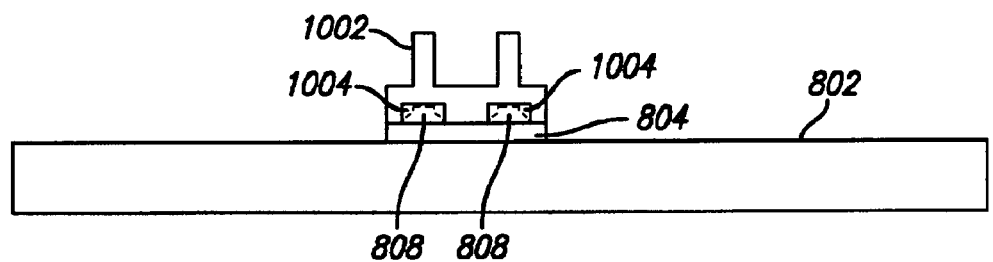

A replacement post piece 1002 is then prepared using method 500 described above, or any other suitable method. The base of piece 1002 is preferably provided with a plurality of legs for contacting the terminal 104 while avoiding contact with the stubs of posts 808. In other words, like the base of replacement spring 314 previously described, the base of piece 1002 is configured to fit over the terminal 804. An upper portion of piece 1002 is provided with one or more (two shown) upwardly projecting posts for replacing the removed posts 808. The height of the piece 1002 is preferably the same as the height of posts 808 above terminal 804 prior to their removal. After piece 1002 is prepared, a dollop of suitable solder paste 1004 is placed on terminal 804 and piece 1002 is positioned on the solder paste as shown in FIG. 10C. An electric current may then be passed through piece 1002 by contacting it with a suitable electrode, thereby activating the solder paste and soldering piece 1002 to terminal 804. The appearance of piece 1002 after being soldered to terminal 804 is shown in FIG. 10D.

Figure 10E:
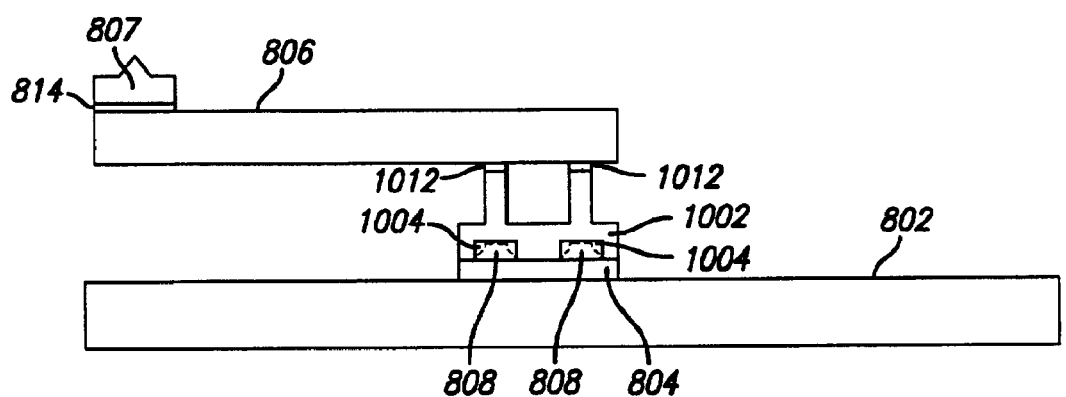

The beam 806 that was removed during an initial step of the repair method may then be attached to an upper surface of piece 1002 using a solder paste 1012. To avoid re-flowing solder paste 1004 during attachment of the beam, solder paste 1012 preferably has an activation temperature lower than that of paste 1004. If the removed beam 806 is for any reason unsuitable for use in the repair, a new beam and tip assembly may be formed, preferably using the same tooling and methods as were used for the original beam and tip. Use of the removed beam 806, or an otherwise essentially identical beam and tip, ensures that the performance of the repaired spring contact will be consistent with the performance of the surrounding spring contacts in the array. The appearance of the finished repaired spring is shown in FIG. 10E.

Having thus described a preferred embodiment of a method for repairing a microelectronic spring contact, it should be apparent to those skilled in the art that certain advantages of the within system have been achieved. It should also be appreciated that various modifications, adaptations, and alternative embodiments thereof may be made within the scope and spirit of the present invention. For example, a specific replacement spring contact and method for making it have been illustrated, but it should be apparent that the inventive concepts described above would be equally applicable for use with other shapes of replacement spring contacts, and other methods for forming them. Indeed, the invention is not limited to use of a spring contact with any particular shape, nor is the invention limited to use of any particular process of forming the spring contacts. It should also that spring contacts of different shapes may be made in the same batch. For example, the recesses 604 illustrated in FIG. 6A may have different shapes, in which case the resulting spring contacts 704 shown in FIG. 7 would also have different shapes one from another. The invention is further defined by the following claims.

What is claimed is:

1. A method for replacing a microelectronic spring contact bonded to a terminal of a substrate, the method comprising:
    removing the microelectronic spring contact from the terminal;
    aligning a replacement spring contact over the terminal, the replacement spring contact comprising a base configured to fit over the terminal, and at least one resilient cantilever arm extending from the base, whereby the replacement spring contact is aligned so that the base of the replacement spring contact is opposite to the terminal and the resilient cantilever arm extends away from the substrate; and
    bonding the replacement spring contact to the terminal.

2. The method of claim 1, wherein the removing step further comprises cutting the microelectronic spring contact in two adjacent to the terminal.

3. The method of claim 1, wherein the bonding step further comprises depositing a bonding material between the terminal and the replacement spring contact.

4. The method of claim 3, wherein the bonding step further comprises depositing the bonding material consisting essentially of a solder paste.

5. The method of claim 4, wherein the bonding step further comprises applying an electric current across the base of the replacement spring contact using an electrode.

6. The method of claim 1, wherein the aligning step further comprises aligning the replacement spring contact having a core of resilient material coated with a conductive material.

7. The method of claim 6, wherein the aligning step further comprises aligning the replacement spring contact having the core made of nickel-cobalt alloy.

8. The method of claim 6, wherein the aligning step further comprises aligning the replacement spring contact having the core coated with gold or a gold alloy.

9. The method of claim 1, wherein the aligning step further comprises aligning the replacement spring contact having the base with at least two legs extending from the base in a direction opposite to the cantilever arm.

10. The method of claim 1, wherein the aligning step further comprises aligning the replacement spring contact whereby the at least two legs are on opposite sides of a stub protruding from the terminal.

11. A method for forming on a substrate a microelectronic spring contact comprising a base at a bottom portion of the spring contact and a tip at a top portion of the spring contact, the method comprising:
    depositing a sacrificial layer;
    patterning the sacrificial layer to form at least one recess in the shape of a side profile of the microelectronic spring contact;
    depositing a contact structure material in the at least one recess;
    releasing the contact structure material from the substrate; and
    depositing a conductive material over the microelectronic spring contact after the releasing step.

12. The method of claim 11, wherein the depositing a conductive material step further comprises plating the conductive material consisting essentially of a layer of gold.

13. A method for forming on a substrate a microelectronic spring contact comprising a base at a bottom portion of the spring contact and a tip at a top portion of the spring contact, the method comprising:
    depositing a sacrificial layer;
    patterning the sacrificial layer to form at least one recess in the shape of a side profile of the microelectronic spring contact; and
    depositing a contact structure material in the at least one recess; releasing the contact structure material from the substrate;
    wherein the side profile is such that an axis extending between the tip and the base is substantially parallel with a surface of the substrate,
    the method further comprising bonding the base to a second substrate after the releasing step, wherein the axis extends away from a surface of the second substrate.

14. The method of claim 13, wherein the step of depositing a contact structure material further comprises electroplating the contact structure material in the at least one recess.

15. The method of claim 13, wherein the contact structure material comprises nickel-cobalt.

16. The method of claim 13, wherein the bonding step further comprises bonding the base to a terminal of the second substrate.

17. The method claim 13, further comprising:
    depositing a release layer on said substrate; and
    depositing a seed layer on said release layer,
    wherein said sacrificial layer is deposited on said seed layer.

18. The method of claim 17, wherein the release layer comprises aluminum.

19. The method of claim 17, wherein the seed layer comprises copper.

20. The method of 17, the sacrificial layer comprises a photoresist.

21. A method for repairing a microelectronic spring contact comprising a beam bonded to at least one post that is in turn bonded to a terminal of a substrate, the method comprising:
    removing the beam from the at least one post, thereby providing a removed beam;
    removing at least a portion of the at least one post from the terminal;
    aligning a replacement post piece over the terminal, the replacement post piece comprising a base configured to fit over the terminal, and at least one replacement post extending upwards from the base, whereby the replacement post piece is aligned so that the base of the replacement post piece is opposite to the terminal and the at least one replacement post extends away from the substrate;
    bonding the replacement post piece to the terminal; and
    bonding a replacement beam to the at least one replacement post, wherein the replacement beam is selected from a group consisting of the removed beam and a new beam essentially identical to the removed beam.

22. The method of claim 21, wherein the first removing step further comprises de-soldering the beam from the at least one post.

23. The method of claim 21, wherein the second removing step further comprises cutting the at least one post in two adjacent to the terminal.

24. The method of claim 21, wherein the first bonding step further comprises applying a solder paste to the terminal.

25. The method of claim 24, wherein the first bonding step further comprises applying an electric current across the replacement post piece to activate the solder paste.

26. The method of claim 21, wherein the second bonding step further comprises applying a solder paste to the at least one replacement post.

27. The method of claim 26, wherein the first bonding step further comprises applying an electric current across a portion of the replacement beam to activate the solder paste.

28. The method of claim 21, wherein the aligning step further comprises aligning the replacement post piece made of nickel-cobalt alloy.

29. The method of claim 21, wherein the aligning step further comprises aligning the replacement post piece having a base with at least two legs extending from the base in a direction opposite to the at least one post.

30. The method of claim 29, wherein the aligning step further comprises aligning the replacement post piece whereby the at least two legs are on opposite sides of a stub protruding from the terminal.

31. A method for forming on a substrate a microelectronic spring contact comprising a base at a bottom portion of the spring contact and a tip at a top portion of the spring contact, the method comprising:
depositing a sacrificial layer:
patterning the sacrificial layer to form at least one recess in the shape of a side profile of the microelectronic spring contact; and
depositing a contact structure material in the at least one recess;
releasing the contact structure material from the substrate;
wherein a first portion of said at least one recess defines said base of said of said spring contact and a second portion of said at least one recess defines said tip of said spring contact, wherein said first portion and said second portion of said at least one recess are disposed in a plane that is substantially parallel to a surface of said substrate.

32. A method of forming an interconnect element, said interconnect element configured to be attached to a final substrate in a first orientation with respect to a surface of said final substrate, said method comprising:
providing a sacrificial substrate; and
forming said interconnect element on said sacrificial substrate in a second orientation with respect to a surface of said sacrificial substrate,
wherein said second orientation is different than said first orientation, and
wherein:
in said first orientation, said interconnect element is upright with respect to said surface of said final substrate; and
in said second orientation, said interconnect is on one of its sides with respect to said surface of said sacrificial substrate.

33. A method of forming an interconnect element, said interconnect element configured to be attached to a final substrate in a first orientation with respect to a surface of said final substrate, said method comprising;
providing a sacrificial substrate; and
forming said interconnect element on said sacrificial substrate in a second orientation with respect to a surface of said sacrificial substrate;
wherein said second orientation is different than said first orientation, and
wherein said interconnect element comprises a base and a tip, and:
in said first orientation, said base is attached to said final substrate, and said tip is spaced apart from said final substrate; and
in said second orientation, said base and said tip are disposed in a plane that is substantially parallel to said surface of said sacrificial substrate.

34. A method of forming an interconnect element, said interconnect element configured to be attached to a final substrate in a first orientation with respect to a surface of said final substrate, said method comprising:
providing a sacrificial substrate; and
forming said interconnect element on said sacrificial substrate in a second orientation with respect to a surface of said sacrificial substrate,
wherein said second orientation is different than said first orientation, and
wherein said interconnect element comprises a base and a tip, and
in said first orientation, an axis extending from said base to said tip extends away from said surface of said final substrate; and
in said second orientation, said axis is substantially parallel to said surface of said sacrificial substrate.

35. A method of forming an interconnect element, said interconnect element configured to be attached to a final substrate in a first orientation with respect to a surface of said final substrate, said method comprising:
providing a sacrificial substrate; and
forming said interconnect element on said sacrificial substrate in a second orientation with respect to a surface of said sacrificial substrate,
wherein said second orientation is different than said first orientation,
wherein said step of forming said interconnect element comprises depositing material in a patterned sacrificial layer, and
wherein said sacrificial layer comprises a photoresist.

36. A method of forming an interconnect element, said interconnect element configured to be attached to a final substrate in a first orientation with respect to a surface of said final substrate, said method comprising:
providing a sacrificial substrate; and
forming said interconnect element on said sacrificial substrate in a second orientation with respect to a surface of said sacrificial substrate,
wherein said second orientation is different than said first orientation,
wherein said step of forming said interconnect element comprises depositing material in a patterned sacrificial layer, and
wherein said sacrificial layer is patterned to define a side profile of said interconnect element.

37. A method of forming an interconnect element, said interconnect element configured to be attached to a final substrate in a first orientation with respect to a surface of said final substrate, said method comprising:

providing a sacrificial substrate; and forming said interconnect element on said sacrificial substrate in a second orientation with respect to a surface of said sacrificial substrate;

wherein said second orientation is different than said first orientation, wherein said step of forming said interconnect element comprises depositing material in a patterned sacrificial layer, and wherein the step of depositing material comprises electroplating said material.

38. The method of claim 37, wherein said step of providing a sacrificial substrate further comprises providing a sacrificial substrate having a seed layer.

39. The method of claim 38, wherein said step of electroplating said material comprises electroplating said material onto said seed layer.

40. A method of forming an interconnect element, said interconnect element configured to be attached to a final substrate in a first orientation with respect to a surface of said final substrate, said method comprising:

providing a sacrificial substrate; and forming said interconnect element on said sacrificial substrate in a second orientation with respect to a surface of said sacrificial substrate, wherein said second orientation is different than said first orientation, said method further comprising forming a plurality of said interconnect elements on said sacrificial substrate.

41. The method of claim 40 further comprising releasing said interconnect element from said sacrificial substrate.

42. The method of claim 41, wherein said step of providing a sacrificial substrate comprises providing a sacrificial substrate having a release layer.

43. The method of claim 42, wherein said step of releasing said interconnect element comprises removing said release layer.

44. The method of claim 41 further comprising attaching said released interconnect element to said final substrate in said first orientation.

45. The method of claim 40, wherein said step of forming said interconnect element comprises depositing material in a patterned sacrificial layer.

46. The method of claim 40, wherein said plurality of interconnect elements are tied together.

47. The method of claim 46, wherein said plurality of interconnect elements are tied together by a tie bar and tabs.

* * * * *